United States Patent
Li et al.

(10) Patent No.: US 11,955,309 B2
(45) Date of Patent: Apr. 9, 2024

(54) AUTOMATIC ADJUSTMENT METHOD AND AUTOMATIC ADJUSTMENT DEVICE OF BEAM OF SEMICONDUCTOR APPARATUS, AND TRAINING METHOD OF PARAMETER ADJUSTMENT MODEL

(71) Applicant: UNITED MICROELECTRONICS CORP., Hsinchu (TW)

(72) Inventors: Zheng-Yang Li, Kaohsiung (TW); Chian-Chen Kuo, Tainan (TW); Yi-Cheng Lu, Kaohsiung (TW); Ji-Fu Kung, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 439 days.

(21) Appl. No.: 17/369,077

(22) Filed: Jul. 7, 2021

(65) Prior Publication Data
US 2022/0384139 A1    Dec. 1, 2022

(30) Foreign Application Priority Data

May 26, 2021    (TW) ................................. 110119006

(51) Int. Cl.
| | |
|---|---|
| *H01L 21/00* | (2006.01) |
| *H01J 27/18* | (2006.01) |
| *H01J 37/08* | (2006.01) |
| *H01J 37/302* | (2006.01) |
| *H01J 37/305* | (2006.01) |
| *H01L 21/67* | (2006.01) |

(52) U.S. Cl.
CPC .............. *H01J 37/08* (2013.01); *H01J 27/18* (2013.01); *H01J 37/302* (2013.01); *H01J 37/3053* (2013.01); *H01L 21/67* (2013.01); *H01L 21/67069* (2013.01); *H01J 2237/083* (2013.01)

(58) Field of Classification Search
CPC .......... H01J 37/08; H01J 27/18; H01J 37/302; H01J 37/3053; H01J 37/305; H01J 2237/083; H01J 2237/30405; H01J 2237/31701; H01J 2237/30472; H01J 27/206; H01J 27/24; H01J 27/22; H01J 2237/3047; H01L 21/67069; H01L 21/67; H01L 21/31116

See application file for complete search history.

(56) References Cited

U.S. PATENT DOCUMENTS

| | | | |
|---|---|---|---|
| 7,605,382 B2 * | 10/2009 | Yamashita | ............ G01N 23/225 |
| | | | 250/492.2 |
| 8,158,016 B2 | 4/2012 | Hayes et al. | |

(Continued)

*Primary Examiner* — Nikolay K Yushin
(74) *Attorney, Agent, or Firm* — WPAT, P.C.

(57) ABSTRACT

An automatic adjustment method and an automatic adjustment device of a beam of a semiconductor apparatus, and a training method of a parameter adjustment model are provided. The automatic adjustment method of the beam of the semiconductor apparatus includes the following steps. The semiconductor apparatus generates the beam. A wave curve of the beam is obtained. The wave curve is segmented into several sections. The slope of each of the sections is obtained. Several environmental factors of the semiconductor apparatus are obtained. According to the slopes and the environmental factors, at least one parameter adjustment command of the semiconductor apparatus is analyzed through the parameter adjustment model.

19 Claims, 6 Drawing Sheets

(56) References Cited

U.S. PATENT DOCUMENTS

2008/0135753 A1* 6/2008 Yamashita .......... H01J 37/3171
  700/286
2022/0148843 A1* 5/2022 Biloiu ............... H01J 37/32559

* cited by examiner

AUTOMATIC ADJUSTMENT METHOD AND AUTOMATIC ADJUSTMENT DEVICE OF BEAM OF SEMICONDUCTOR APPARATUS, AND TRAINING METHOD OF PARAMETER ADJUSTMENT MODEL

This application claims the benefit of Taiwan application Serial No. 110119006, filed May 26, 2021, the subject matter of which is incorporated herein by reference.

BACKGROUND OF THE INVENTION

Field of the Invention

The invention relates in general to an automatic adjustment method, an automatic adjustment device and a model training method, and more particularly to an automatic adjustment method and an automatic adjustment device of a beam of a semiconductor apparatus, and a training method of a parameter adjustment model.

Description of the Related Art

In the semiconductor process, some semiconductor apparatuses require the application of beam. The application of beam is such as ion beam implantation technology, electron beam lithography, extreme ultraviolet (EUV) lithography, and electron beam evaporation technology.

In some applications of beam, the gentleness of the wave of the beam greatly affects the yield rate of the manufacturing process. Therefore, the operator must execute some parameter adjustment commands on the semiconductor apparatus, such that the beam can achieve the best gentleness of the wave.

SUMMARY OF THE INVENTION

The invention is directed to an automatic adjustment method and an automatic adjustment device of a beam of a semiconductor apparatus and a training method of a parameter adjustment model, in which the parameter adjustment command of the semiconductor apparatus is automatically analyzed through the parameter adjustment model. The parameter adjustment command recommended by the parameter adjustment model enables the beam to achieve the best gentleness of the wave.

According to one embodiment of the present invention, an automatic adjustment method of a beam of a semiconductor apparatus is provided. The automatic adjustment method of a beam of a semiconductor apparatus includes the following steps. The beam is generated by the semiconductor apparatus. A wave curve of the beam is obtained. The wave curve is segmented into several sections. A slope of each of the sections is obtained. Several environmental factors of the semiconductor apparatus are obtained. At least one parameter adjustment command of the semiconductor apparatus is analyzed through a parameter adjustment model according to the slopes and the environmental factors.

According to another embodiment of the present invention, an automatic adjustment device of a beam of a semiconductor apparatus is provided. The automatic adjustment device of a beam of a semiconductor apparatus incudes an input unit, a segmentation unit, a calculation unit and a parameter adjustment model. The input unit is configured to obtain a wave curve of the beam and several environmental factors of the semiconductor apparatus. The segmentation unit is configured to segment the wave curve into several sections. The calculation unit is configured to calculate a slope of each of the sections. The parameter adjustment model is configured to analyze at least one parameter adjustment command of the semiconductor apparatus according to the slopes and the environmental factors.

According to an alternate embodiment of the present invention, a training method of a parameter adjustment model of a semiconductor apparatus is provided. The semiconductor apparatus has a beam. The training method includes the following steps. Several environmental factors of the semiconductor apparatus are obtained. A parameter adjustment command of the semiconductor apparatus is obtained. The beam is generated by the semiconductor apparatus according to the parameter adjustment command. A wave curve of the beam is obtained. The wave curve is segmented into several sections. A slope of each of the sections is obtained. A parameter adjustment model is trained according to the environmental factors, the slopes and the parameter adjustment command.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
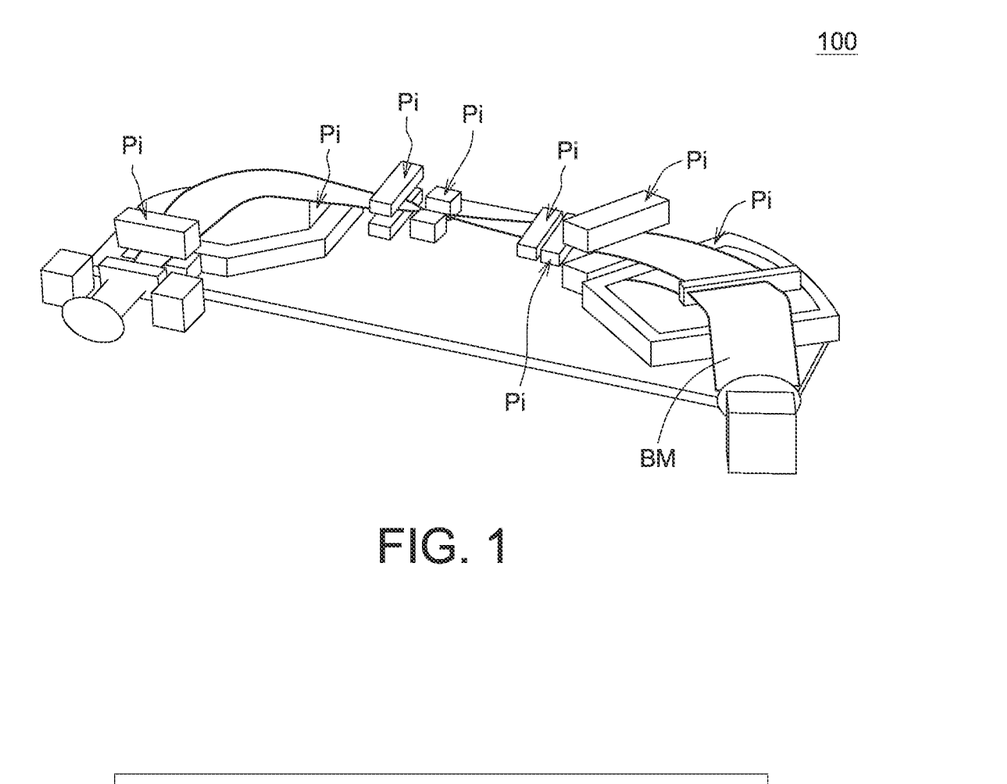
FIG. 1 is a schematic diagram of a semiconductor apparatus according to an embodiment.
Figure 2:
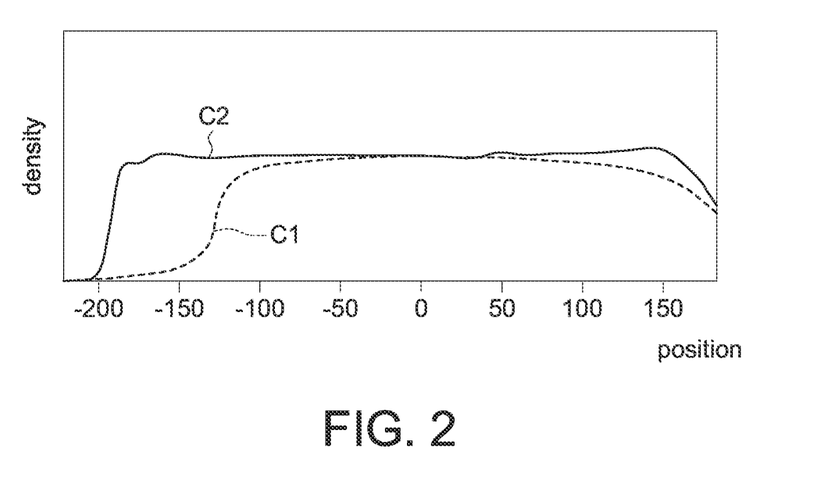
FIG. 2 is a density distribution chart of a beam according to an embodiment.

Referring to FIG. 1, a schematic diagram of a semiconductor apparatus 100 according to an embodiment is shown. The semiconductor apparatus 100 can generate a beam BM, such as an ion beam, a laser beam or an electron beam. The beam BM of FIG. 1 is such as an ion beam. Referring to FIG. 2, a density distribution chart of a beam BM according to an embodiment is shown. As indicated in FIG. 2, curve C1 reflects the density distribution before the beam BM is adjusted. The operator can adjust the beam BM through the setting of the operation parameter Pi. As indicated in FIG. 2, curve C2 is an adjustment target of the beam BM. The adjustment target of the beam BM aims to achieve the best gentleness of the wave, such that the energy of the beam BM can be evenly distributed, and the yield rate of the manufacturing process can be increased. For example, during the ion implantation process, the ion density of the ion beam must be evenly distributed, such that all mixed areas can receive an equivalent amount of ion implantation.

Figure 3:
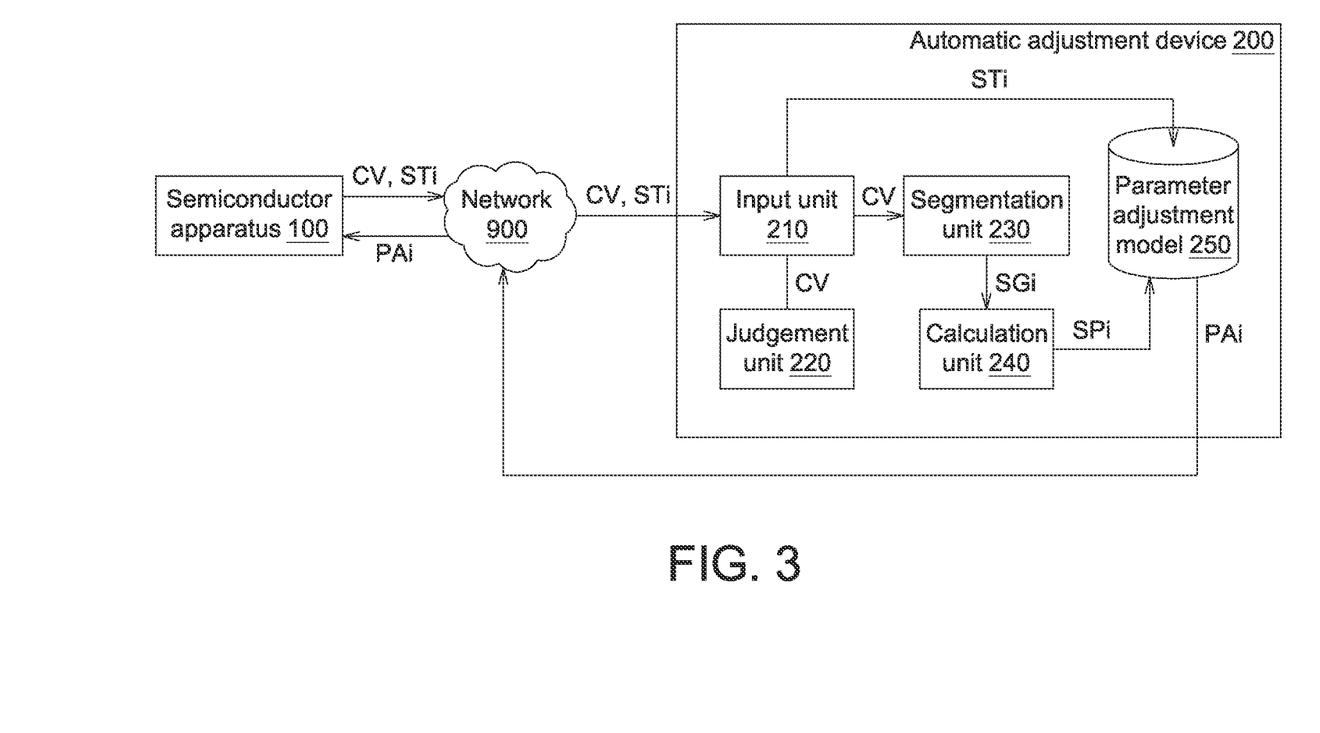
FIG. 3 is a schematic diagram of an automatic adjustment device of a beam of a semiconductor apparatus according to an embodiment.

Referring to FIG. 3, a schematic diagram of an automatic adjustment device 200 of the beam BM of the semiconductor apparatus 100 according to an embodiment is shown. The automatic adjustment device 200 can be connected to the semiconductor apparatus 100 through a network 900 at a remote end or can be directly disposed in the semiconductor apparatus 100. The automatic adjustment device 200 includes an input unit 210, a judgement unit 220, a segmentation unit 230, a calculation unit 240 and a parameter adjustment model 250. The functions of those elements are disclosed below. The input unit 210 is used to obtain various information and can be realized by a transmission line or a wireless transmission module. The judgement unit 220 is used to perform a judgement procedure. The segmentation unit 230 is used to perform a segmentation procedure. The calculation unit 240 is used to perform a calculation procedure. The judgement unit 220, the segmentation unit 230 and/or the calculation unit 240 can be realized by a circuit, a code, a circuit board, a chip or a storage device for storing programming codes. The parameter adjustment model 250 is a machine learning model. In the present embodiment, at least one parameter adjustment command PAi of the semiconductor apparatus 100 can be automatically analyzed through the parameter adjustment model 250. With the parameter adjustment command PAi, the operator can adjust the parameter of the semiconductor apparatus 100, such that the beam BM can achieve the best gentleness of the wave. Details of the operations of each of the above elements are disclosed below with an accompanying flowchart.

Figure 4:
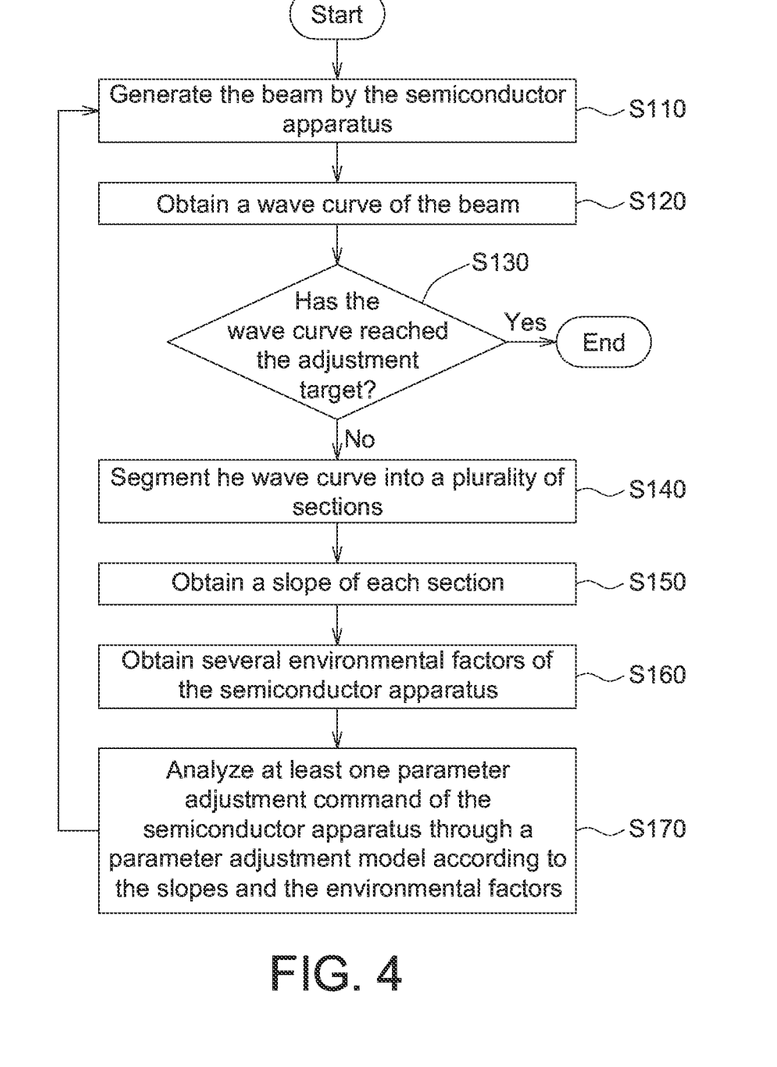
FIG. 4 is a flowchart of an automatic adjustment method of a beam of a semiconductor apparatus according to an embodiment.

Referring to FIG. 4, a flowchart of an automatic adjustment method of a beam BM of a semiconductor apparatus 100 according to an embodiment is shown. In step S110, the beam BM is generated by the semiconductor apparatus 100. Meanwhile, the semiconductor apparatus 100 can be at the initial state or an adjusted state.

Figure 5:
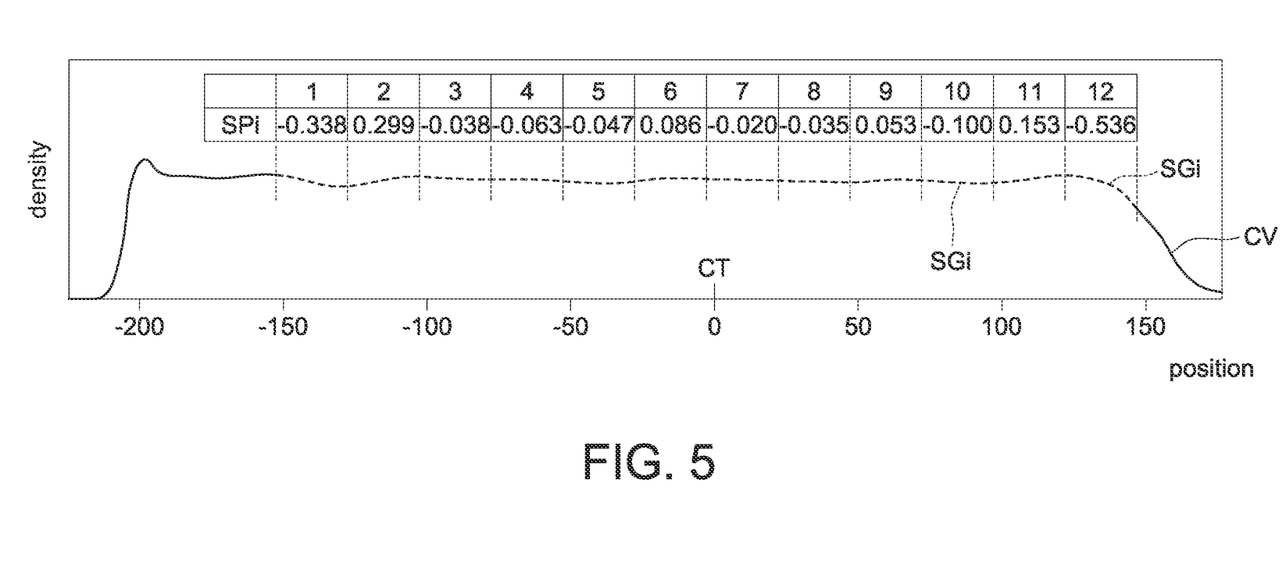
FIG. 5 is a schematic diagram of a wave curve according to an embodiment.

Then, the method proceeds to step S120, a wave curve CV of the beam BM is obtained by the input unit 210. Referring to FIG. 5, a schematic diagram of the wave curve CV according to an embodiment is shown. The wave curve CV reflects the density distribution of the beam BM at several positions arranged in a continuous manner.

Then, the method proceeds to step S130, whether the wave curve CV has achieved an adjustment target is determined by the judgement unit 220. If the wave curve CV has already achieved the adjustment target, then the method terminates; if the wave curve CV has not yet achieved the adjustment target, then the method proceeds to step S140.

Then, the method proceeds to step S140, as indicated in FIG. 5, the wave curve is segmented into several sections SGi by the segmentation unit 230. The number of sections SGi can be the same as the number of magnetic fields of the semiconductor apparatus 100. As indicated in FIG. 5, the number of sections SGi is such as 12. The sections SGi are connected and have the same length. The sections SGi are symmetrically distributed with respect to the central point CT of the beam BM.

Then, the method proceeds to step S150, as indicated in FIG. 5, a slope SPi of each section SGi is obtained by the calculation unit 240. The slope SPi is such as an average slope of each of the sections SGi. In the present step, the slopes SPi of the sections SGi are such as [−0.338, 0.299, −0.038, −0.063, −0.047, 0.086, −0.020, −0.035, 0.053, −0.100, 0.153, −0.536]. The slopes SPi are arranged in the order of the sections SGi. In an embodiment, the absolute values of the slopes SPi are: [0.338, 0.299, 0.038, 0.063, 0.047, 0.086, 0.020, 0.035, 0.053, 0.100, 0.153, 0.536].

Then, the method proceeds to step S160, several environmental factors STi of the semiconductor apparatus 100 are obtained by the input unit 210. The environmental factors STi are values of fundamental parameters, such as gas concentration, pressure, temperature, and power. Each environmental factor STi affects the beam BM and needs to be obtained through the input unit 210.

Figure 6:
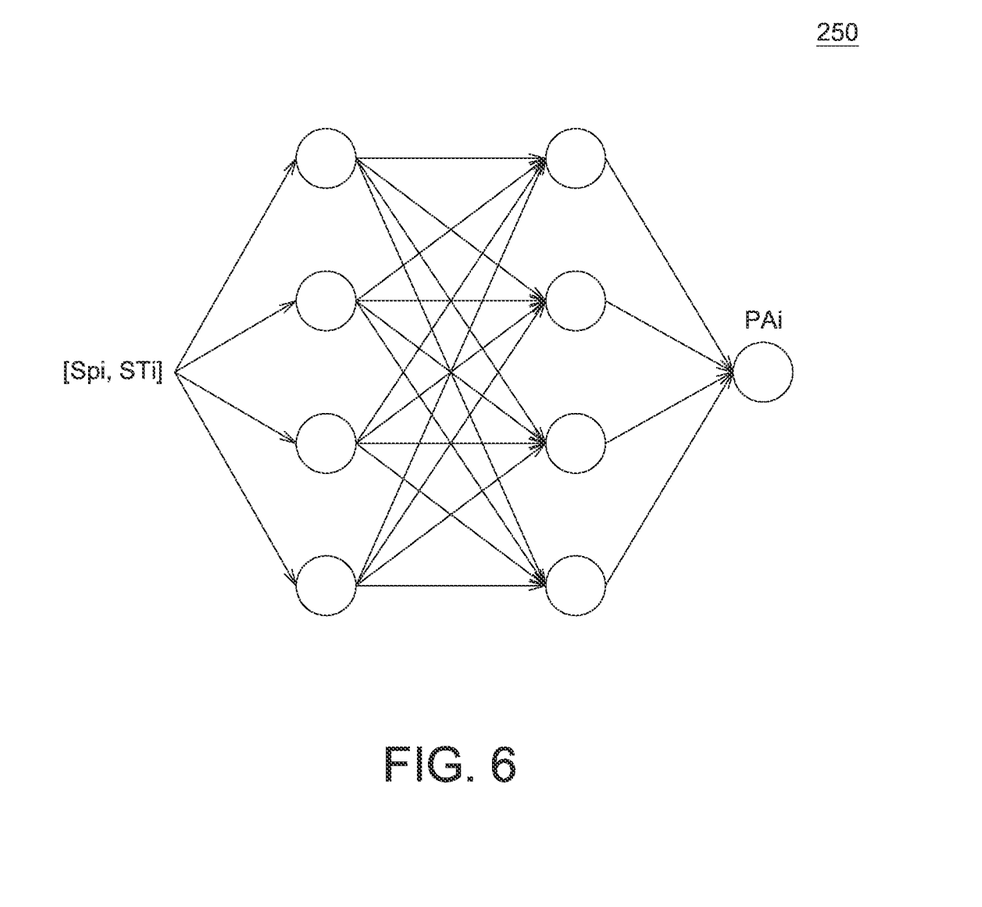
FIG. 6 is a schematic diagram illustrating a parameter adjustment model.

Then, the method proceeds to step S170, at least one parameter adjustment command PAi of the semiconductor apparatus 100 is analyzed by the parameter adjustment model 250 according to the slopes SPi and the environmental factors STi. Referring to FIG. 6, a schematic diagram illustrating a parameter adjustment model 250 is shown. The parameter adjustment model 250 is such as the deep Q networks of the reinforcement learning technology. In the present step, the slopes SPi and the environmental factors STi together are inputted to the parameter adjustment model 250 in a predetermined order and at last at least one parameter adjustment command PAi is outputted. For example, the number of slopes SPi is such as 12, the number of environmental factors STi is such as 30, and the 12 slopes SPi together with the 30 environmental factors STi (42 values in total) are inputted to the parameter adjustment model 240.

The number of parameter adjustment commands PAi can be one or several. Each parameter adjustment command PAi is an upward adjustment command or a downward adjustment command. The span of adjustment can be a predetermined value of a span of adjustment. Different predetermined values of the span of adjustment can be set with respect to the parameter adjustment commands PAi. After the parameter adjustment command PAi is obtained through the parameter adjustment model 250, the operator can perform adjustment on the semiconductor apparatus 100 according to the parameter adjustment command PAi. After the semiconductor apparatus 100 is adjusted, the method returns to step S110, the automatic adjustment method of the beam BM of the semiconductor apparatus 100 is performed again until the wave curve CV reaches the adjustment target.

The automatic adjustment method can be performed on the beam BM of the semiconductor apparatus 100 through the parameter adjustment model 250 which automatically performs analysis without relying on the operator's manual adjustment. Details of the training method of the parameter adjustment model 250 are disclosed below.

Figure 7:
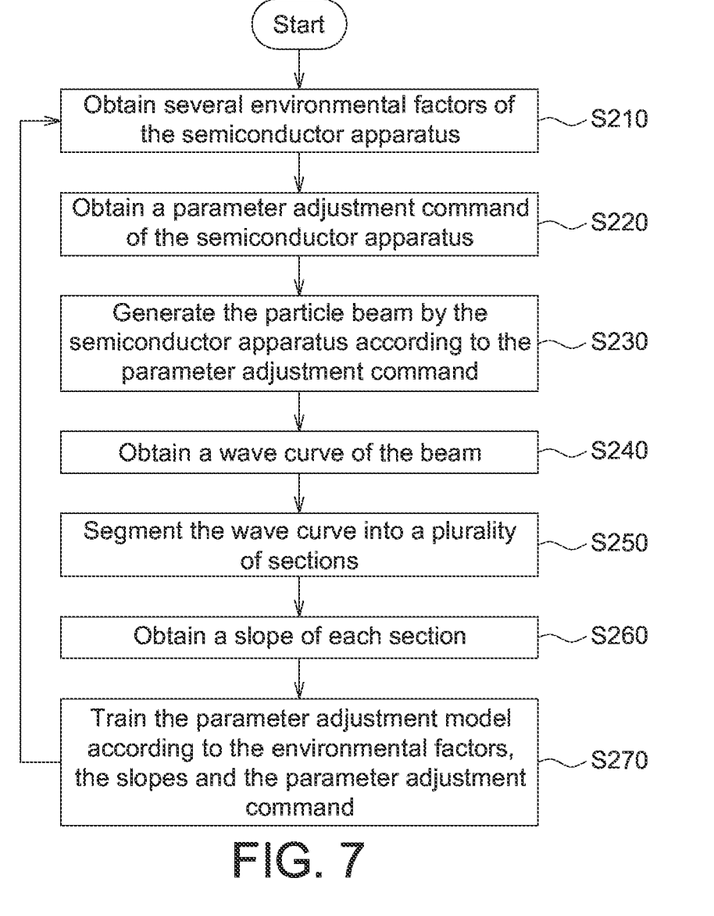
FIG. 7 is a flowchart of a training method of a parameter adjustment model of a semiconductor apparatus according to an embodiment.

Referring to FIG. 7, a flowchart of a training method of the parameter adjustment model 250 of the semiconductor apparatus 100 according to an embodiment is shown. In step S210, the environmental factors STi of the semiconductor apparatus 100 are obtained. The environmental factors STi are such as the initial state or any state of the semiconductor apparatus 100.

Then, the method proceeds to step S220, the parameter adjustment commands PAi of the semiconductor apparatus 100 are obtained. In the present step, only one parameter adjustment command PAi can be provided. Each parameter adjustment command PAi is an upward adjustment command or a downward adjustment command. The span of adjustment can be a predetermined value of a span of adjustment. Different predetermined values of the span of adjustment can be set with respect to the parameter adjustment commands PAi.

In another embodiment, several parameter adjustment commands PAi can be provided. The parameter adjustment commands PAi, which are interlinked, can be concurrently adjusted according to a predetermined rule.

Then, the method proceeds to step S230, the beam BM is generated by the semiconductor apparatus 100 according to the parameter adjustment command PAi.

Then, the method proceeds to step S240, the wave curve CV of the beam BM is obtained.

Then, the method proceeds to step S250, the wave curve CV is segmented into several sections SGi. The number of sections SGi can be the same as the number of magnetic fields of the semiconductor apparatus 100. The sections SGi are symmetrically distributed with respect to the central point CT of the beam BM. In the training process, each segmentation is performed according to the same number, the same length and the same position.

Then, the method proceeds to step S260, the slope SPi of each section SGi is obtained. The slope SPi is such as an average slope of each section SGi.

Figure 8:
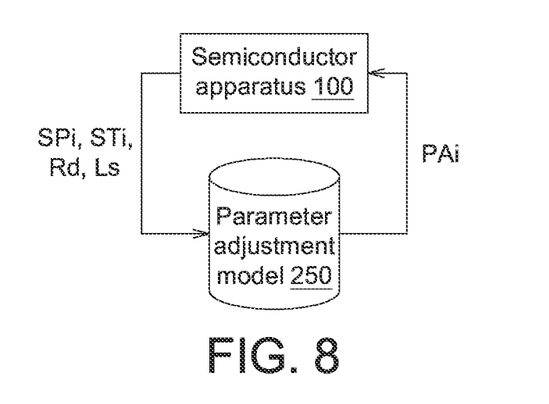
FIG. 8 is a training process of a parameter adjustment model according to an embodiment.

Then, the method proceeds to step S270, the parameter adjustment model 250 is trained according to the environmental factors STi, the slopes SPi and the parameter adjustment command PAi. Referring to FIG. 8, a training process of a parameter adjustment model 250 according to an embodiment is shown. In step S270, reinforcement learning reward Rd or loss Ls is assigned according to the gentleness of the slopes SPi of the sections SGi. For example, a reward Rd of +0.1 is assigned to the slope SPi whose absolute value is lower than 0.3; a loss Ls of −0.1 is assigned to the slope SPi whose absolute value is higher than 0.3. The values of the reward Rd and the loss Ls are accumulated and fed back to the parameter adjustment model 250. When the reward Rd is high and the loss Ls is low, this indicates that the parameter adjustment command PAi set at this time is correct. In the future, when the environmental factors STi and the slopes SPi remain the same, the parameter adjustment model 250 will be inclined to recommend the parameter adjustment command PAi set at this time.

In another embodiment, a reward Rd of +0.1 can be assigned to the slope SPi whose absolute value is lower than 0.3, and the loss can be omitted.

According to the above embodiments, the parameter adjustment command PAi of the semiconductor apparatus 100 can be automatically analyzed through the parameter adjustment model 250. The parameter adjustment command PAi recommended by the parameter adjustment model 250 enables the beam BM to achieve the best gentleness of the wave. Moreover, the parameter adjustment model 250 can recommend the most suitable parameter adjustment command PAi at one time and the beam BM can directly achieve the best gentleness of the wave without having to go through several adjustments.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An automatic adjustment method of a beam of a semiconductor apparatus, comprises:
    generating the beam by the semiconductor apparatus;
    obtaining a wave curve of the beam;
    segmenting the wave curve into a plurality of sections;
    obtaining a slope of each of the sections;
    obtaining a plurality of environmental factors of the semiconductor apparatus; and
    analyzing at least one parameter adjustment command of the semiconductor apparatus through a parameter adjustment model according to the slopes and the environmental factors.

2. The automatic adjustment method according to claim 1, wherein a quantity of the sections is identical to a quantity of magnetic fields of the semiconductor apparatus.

3. The automatic adjustment method according to claim 1, wherein the sections have identical length.

4. The automatic adjustment method according to claim 1, wherein each of the environmental factors affects the beam.

5. The automatic adjustment method according to claim 1, wherein a quality of at least one parameter adjustment command is pleural.

6. The automatic adjustment method according to claim 1, wherein the at least one parameter adjustment command is an upward adjustment command or a downward adjustment command.

7. A automatic adjustment device of a beam of a semiconductor apparatus, comprising:
    an input unit, configured to obtain a wave curve of the beam and a plurality of environmental factors of the semiconductor apparatus;
    a segmentation unit, configured to segment the wave curve into a plurality of sections;
    a calculation unit, configured to calculate a slope of each of the sections; and
    a parameter adjustment model, configured to analyze at least one parameter adjustment command of the semiconductor apparatus according to the slopes and the environmental factors.

8. The automatic adjustment device according to claim 7, wherein a quantity of the sections is identical to a quantity of magnetic fields of the semiconductor apparatus.

9. The automatic adjustment device according to claim 7, wherein the sections have identical length.

10. The automatic adjustment device according to claim 7, wherein each of the environmental factors affects the beam.

11. The automatic adjustment device according to claim 7, wherein a quantity of at least one parameter adjustment command is pleural.

12. The automatic adjustment device according to claim 7, wherein the at least one parameter adjustment command is an upward adjustment command or a downward adjustment command.

13. A training method of a parameter adjustment model of a semiconductor apparatus, wherein the semiconductor apparatus has a beam, and the training method comprises:
    obtaining a plurality of environmental factors of the semiconductor apparatus;
    obtaining a parameter adjustment command of the semiconductor apparatus;
    generating the beam by the semiconductor apparatus according to the parameter adjustment command;
    obtaining a wave curve of the beam;
    segmenting the wave curve into a plurality of sections;
    obtaining a slope of each of the sections; and
    training the parameter adjustment model according to the environmental factors, the slopes and the parameter adjustment command.

14. The training method according to claim 13, wherein a quantity of sections is identical to a quantity of magnetic fields of the semiconductor apparatus.

15. The training method according to claim 13, wherein the sections have identical length.

16. The training method according to claim 13, wherein each of the environmental factors affects the beam.

17. The training method according to claim 13, wherein a quantity of the at least one parameter adjustment command is pleural.

18. The training method according to claim 13, wherein the at least one parameter adjustment command is an upward adjustment command or a downward adjustment command.

19. The training method according to claim 13, wherein in the step of training the parameter adjustment model, reinforcement learning reward or loss is assigned according to gentleness of the slopes of the sections.

* * * * *